United States Patent
Williford

(10) Patent No.: US 7,968,411 B2
(45) Date of Patent: *Jun. 28, 2011

(54) THRESHOLD VOLTAGE ADJUSTMENT FOR LONG-CHANNEL TRANSISTORS

(75) Inventor: Ethan Williford, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 3 days.

This patent is subject to a terminal disclaimer.

(21) Appl. No.: 11/932,209

(22) Filed: Oct. 31, 2007

(65) Prior Publication Data

US 2008/0054375 A1 Mar. 6, 2008

Related U.S. Application Data

(60) Continuation of application No. 11/081,336, filed on Mar. 16, 2005, now Pat. No. 7,422,948, which is a division of application No. 10/690,399, filed on Oct. 20, 2003, now Pat. No. 7,274,076.

(51) Int. Cl.
*H01L 21/00* (2006.01)

(52) U.S. Cl. .......... 438/289; 438/301; 438/302

(58) Field of Classification Search .......... 438/289, 438/301, 302
See application file for complete search history.

(56) References Cited

U.S. PATENT DOCUMENTS

| | | |
|---|---|---|
| 4,784,965 A | 11/1988 | Woo et al. |
| 4,924,280 A | 5/1990 | Fukuda et al. |
| 4,975,385 A | 12/1990 | Beinglass et al. |
| 5,091,324 A | 2/1992 | Hsu et al. |
| 5,136,349 A | 8/1992 | Yilmaz et al. |
| 5,286,981 A | 2/1994 | Lilja et al. |
| 5,364,807 A | 11/1994 | Hwang |
| 5,432,126 A | 7/1995 | Oikawa |
| 5,510,639 A | 4/1996 | Okuda et al. |
| 5,610,089 A | 3/1997 | Iwai et al. |
| 5,631,485 A | 5/1997 | Wei et al. |
| 5,661,059 A | 8/1997 | Liu et al. |
| 5,858,825 A | 1/1999 | Alsmeier et al. |
| 5,978,258 A | 11/1999 | Manning |
| 6,078,082 A | 6/2000 | Bulucea |
| 6,081,662 A | 6/2000 | Murakami et al. |
| 6,096,616 A | 8/2000 | Nistler et al. |
| 6,107,129 A | 8/2000 | Gardner et al. |
| 6,150,204 A | 11/2000 | Ahmad et al. |
| 6,255,174 B1 | 7/2001 | Yu |
| 6,262,460 B1 | 7/2001 | Kalnitsky et al. |
| 6,287,922 B1 | 9/2001 | Yu et al. |
| 6,297,082 B1 | 10/2001 | Lin et al. |
| 6,326,254 B1 | 12/2001 | Ema et al. |
| 6,333,523 B1 | 12/2001 | Sakamoto et al. |
| 6,383,856 B2 | 5/2002 | Inumiya et al. |
| 6,417,085 B1 | 7/2002 | Batra et al. |
| 6,495,885 B1 | 12/2002 | Ahmad et al. |
| 6,503,805 B2 | 1/2003 | Wang et al. |
| 6,524,901 B1 | 2/2003 | Trivedi |
| 6,534,351 B2 | 3/2003 | Muller et al. |
| 6,552,394 B2 | 4/2003 | Ahmad et al. |
| 6,599,804 B2 | 7/2003 | Bulucea et al. |
| 6,649,461 B1 | 11/2003 | Lai et al. |
| 6,936,517 B2 | 8/2005 | Choi et al. |
| 7,422,948 B2 * | 9/2008 | Williford ............. 438/289 |
| 2003/0170957 A1 | 9/2003 | Hu et al. |
| 2005/0064710 A1 * | 3/2005 | Chidambarrao et al. ..... 438/689 |

* cited by examiner

*Primary Examiner* — Long Pham
(74) *Attorney, Agent, or Firm* — TraskBritt

(57) ABSTRACT

A threshold voltage adjusted long-channel transistor fabricated according to short-channel transistor processes is described. The threshold-adjusted transistor includes a substrate with spaced-apart source and drain regions formed in the substrate and a channel region defined between the source and drain regions. A layer of gate oxide is formed over at least a part of the channel region with a gate formed over the gate oxide. The gate further includes at least one implant aperture formed therein with the channel region of the substrate further including an implanted region within the channel between the source and drain regions. Methods for forming the threshold voltage adjusted transistor are also disclosed.

14 Claims, 7 Drawing Sheets

THRESHOLD VOLTAGE ADJUSTMENT FOR LONG-CHANNEL TRANSISTORS

CROSS-REFERENCE TO RELATED APPLICATIONS

This application is a continuation of application Ser. No. 11/081,336, filed Mar. 16, 2005, now U.S. Pat. No. 7,422,948, issued Sep. 9, 2008, which is a divisional of application Ser. No. 10/690,399, filed Oct. 20, 2003, now U.S. Pat. No. 7,274,076, issued Sep. 25, 2007, the disclosure of each of which is hereby incorporated herein by this reference in its entirety.

BACKGROUND OF THE INVENTION

1. Field of the Invention

The present invention relates to semiconductor devices and, more particularly, to threshold voltage adjustment of long-channel MOS transistors.

2. State of the Art

Metal-Oxide-Semiconductor (MOS) is the primary technology for large-scale integrated semiconductor circuits. In Complementary MOS (CMOS) architectures, these semiconductor circuits combine two types of MOS devices, namely p-channel MOS (PMOS) devices and n-channel MOS (NMOS) devices, on the same integrated circuit. An MOS transistor is a four-terminal device which controls the current that flows between two of the terminals by activating and deactivating the voltage which is applied to the third or fourth terminal. FIG. 1 shows a cross-sectional diagram of a conventional n-channel MOS transistor 10. As shown in FIG. 1, transistor 10 includes spaced-apart n+ source and drain regions 12 and 14 which are formed in a p-type substrate 16, and a channel region 18 which is defined between source and drain regions 12 and 14. Source and drain regions 12 and 14, in turn, represent the first two terminals of the device while substrate 16 represents the third terminal.

Transistor 10 also includes a layer, illustrated as gate oxide 20, which is formed over channel region 18, and a gate 22 which is formed over gate oxide 20. Gate 22 represents the fourth terminal of the device. During operation of the transistor 10, electrons flow from source region 12 to drain region 14 when an electric field is established between source and drain regions 12 and 14. Furthermore, the drain-to-substrate junction is reverse biased when a gate voltage equal to or greater an the threshold voltage of transistor 10 is applied to gate 22. These conditions can be met, for example, when ground is applied to substrate 16 and source region 12, and one volt, for example, is applied to drain region 14.

A gate voltage applied to gate 22 attracts electrons to the surface adjacent to gate oxide 20 of substrate 16 in channel region 18. When a minimum number of electrons has been attracted to the surface of substrate 16 in channel region 18, the electrons form a channel which allows the electrons in source region 12 to flow to drain region 14 under the influence of the electric field. The threshold voltage is defined as the minimum gate voltage that must be applied to gate 22 to attract the minimum number of electrons to the surface of substrate 16 to form an electrically conductive inversion region in the channel region 18.

The threshold voltage of transistor 10 may be altered or adjusted by implanting the surface of substrate 16 in channel region 18 with, for example, a p-type dopant which, in turn, decreases the number of electrons that can be accumulated at the surface in the channel region 18. Since fewer electrons are available, a higher gate voltage is needed to attract the minimum number of electrons that are required to form an inversion layer in the channel region 18. A threshold voltage adjustment implant is commonly referred to as an "enhancement" implant.

MOS transistors are formed using photolithographic processes according to design rules corresponding to a particular process. The design rules specify, among other things, the minimum length of the channel region. To gain performance advantages and as processing technology advancements have been achieved, the channel length between the source and drain has generally shortened. Furthermore, to minimize the silicon area consumed by an MOS circuit, a typical integrated circuit design is largely implemented with transistors that have the minimum channel length. Since the circuit is largely implemented with transistors that have the minimum channel length, the fabrication process, for example, the enhancement implant, is commonly optimized to adjust the threshold voltages of the transistors that have the minimum channel length. While performance improvement is generally a paramount objective for MOS circuit design, it is common for circuits, in addition to utilizing transistors having minimum channel length, to also require transistors which have channel lengths that are longer than the minimum. For those transistors with a longer channel length, a lower threshold voltage is realized when the threshold voltage is optimized for a shorter channel transistor through the use of a single enhancement implant.

FIG. 2 is a graph that generally plots the threshold voltages as a function of channel length. As shown in FIG. 2, when the threshold voltage is optimized for an arbitrary fabricable channel length x, the threshold voltage of a transistor decreases as the channel length of the transistor increases. Furthermore, the reduced threshold voltages of the longer channel devices lead to increased leakage currents which, in turn, are particularly undesirable in circuits which are utilized in battery-operated devices.

One prior solution to this problem is to utilize multiple threshold voltage adjusting enhancement implants. In a first step, dopants are implanted into the surface of the substrate to adjust the threshold voltages of the short-channel transistors while the long-channel transistors are protected from the implant. In a second step, dopants are implanted into the surface of the substrate to adjust the threshold voltages of the long or longer channel transistors while the short-channel transistors are protected from the implant. By utilizing, for example, two implant steps, the dopant concentration for the short and long-channel lengths can be separately optimized.

One shortcoming to the multiple-threshold adjusting implant approach, however, is that utilizing separate implant steps requires separate masks which, in turn, increases the cost of fabricating the circuit. Thus, there is a need for adjusting the threshold voltage of long-channel MOS transistors to a higher threshold voltage when the long-channel transistor is fabricated with a single threshold-voltage implant step that is optimized to set the threshold voltage of a short-channel transistor.

BRIEF SUMMARY OF THE INVENTION

The present invention, in exemplary embodiments, is directed to threshold voltage adjustments for long-channel transistors fabricated using processes optimized for short-channel transistors. In one embodiment of the present invention, a threshold-adjusted transistor includes a substrate with spaced-apart source and drain regions formed in the substrate and a channel region defined between the source and drain regions. A layer of gate oxide is formed over at least a part of the channel region with a gate formed over the gate oxide. The gate further includes at least one implant aperture formed therein with the channel region of the substrate further including an implanted region within the channel between the source and drain regions.

In another embodiment of the present invention, a method is provided for forming a transistor. A gate is formed having source and drain ends and insulated from a substrate with the gate including at least one aperture extending therethrough to the substrate. Doped regions are formed in the substrate adjacent to the drain and source ends as separated by a channel region and also one or more doped regions are formed in the substrate below the aperture of the gate. Source and drain regions are then formed in the substrate adjacent to the source and drain ends of the gate.

In yet another embodiment of the present invention, a method is provided for adjusting a threshold voltage of a long-channel transistor in a fabrication process optimized for short-channel transistors. At least one aperture is formed in a gate on a substrate with a first dopant implanted trough the at least one aperture into a channel region of the substrate. The first implanted dopant is annealed into the channel of the long-channel transistor.

In yet a further embodiment of the present invention, a method for manufacturing an MOS structure on a semiconductor substrate is provided. A gate oxide layer is formed over the semiconductor substrate with a polysilicon layer also being formed over the gate oxide layer. A first mask layer is formed and patterned followed by etching to form a gate. The gate includes an aperture between the source and drain ends of the polysilicon layer. Implant regions are formed in the substrate adjacent to the drain and source ends of the gate. Also, at least one implant region is formed in the substrate through the aperture of the gate. Source and drain regions are formed in the substrate adjacent to the source and drain ends of the gate.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
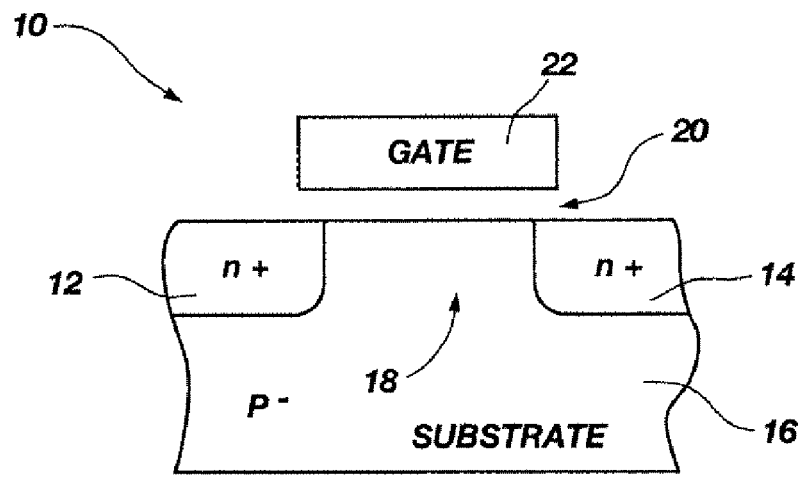
FIG. 1 illustrates the elements of a semiconductor transistor, in accordance with the prior art.
Figure 2:
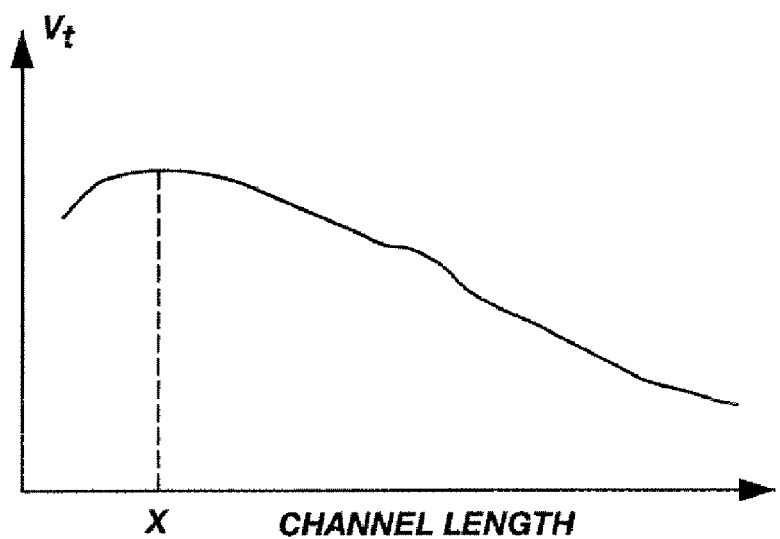
FIG. 2 graphically illustrates the relationship between a transistor threshold voltage and the channel length of a transistor, in accordance with the prior art.

While short-channel transistors are susceptible to decreased threshold voltages and therefore utilize threshold voltage adjusting enhancement implants for adjusting the threshold voltage, short-channel transistors are also susceptible to so-called "hot carrier effects." Generally, as the channel length is shortened, the maximum electric field $E_m$ becomes more isolated near the drain side of the channel, causing a saturated condition that increases the maximum energy on the drain side of the MOS device. The high energy causes electrons in the channel region to become "hot." A electron generally becomes hot in the vicinity of the drain edge of the channel where the energy arises. Hot electrons can degrade device performance and cause breakdown of the device. Moreover, the hot electrons can overcome the potential energy barrier between the silicon substrate and the silicon dioxide layer overlying the substrate, which causes hot electrons to be injected into the gate oxide.

Problems arising from hot carrier injections into the gate oxide include generation of a gate current and generation of a positive trapped charge which can permanently increase the threshold voltage of the MOS device. These problems are manifested as an undesirable decrease in saturation current, decrease of the transconductance and a continual reduction in device performance caused by trapped charge accumulation. Thus, hot carrier effects cause unacceptable performance degradation in MOS devices built with conventional drain structures when channel lengths are short.

Reducing the maximum electric field $E_m$ in the drain side of the channel is a popular way to control the hot carrier injections. A common approach to reducing $E_m$ is to minimize the abruptness in voltage changes near the drain side of the channel. Disbursing abrupt voltage changes reduces $E_m$, strength and the harm hot carrier effects resulting therefrom. Reducing $E_m$ occurs by replacing an abrupt drain doping profile with a more gradually varying doping profile. A more gradual doping profile distributes $E_m$ along a larger lateral distance so that the voltage drop is shared by the channel and the drain. Absent a gradual doping profile, an abrupt junction can exist where almost all of the voltage drop occurs across the channel. The smoother or more gradual the doping profile, the smaller $E_m$ becomes resulting in reduced hot carrier injections.

One approach for minimizing the effects associated with hot carrier injections includes forming a modified drain structure, such as lightly doped drain (LDD) structure. LDD structures provide a doping gradient at the drain side of the channel that lead to the reduction in $E_m$. The LDD structures act as parasitic resistors to absorb some of the energy into the drain and thus reduce maximum energy in the channel region. This reduction in energy reduces the formation of hot electrons. In most typical SDD structures of MOS devices, sources/drains are formed by two implants with dopants, one implant self-aligned to the polysilicon gate to form shallow source/drain extension junctions that are lightly doped source/drain regions and a second implant with a heavier dose to form the actual deep source/drain junctions.

In addition to the concern over hot carrier injection in short channels, a condition known as "punch-through" is also of concern. To her protect the transistor from punch-through conditions, a double diffusion (DD) process may further surround the LDDs. The DD process implants one or more dopants into the same region followed by a high temperature annealing step, in which the one or more dopants diffuse simultaneously, and form a structure called a double-diffused (DD) region, also commonly called a double-diffused drain (DDD). In an exemplary DD process, a medium phosphorus dose and a heavy arsenic dose may be implanted; but in both cases a p-type Boron halo implant is put in to surround the n-type LDD implant to protect against "punch-through." The faster-diffusing phosphorus is driven farther under the gate edge than the arsenic, creating a less abrupt concentration gradient for the drain.

When transistor channel lengths are several times longer than the diameter of the LDD and DD regions, the threshold voltage adjusting or enhancement implant exhibits the dominant effect over the other adjacent implants. However, as fabrication processes improve, transistor channel lengths generally decrease. In short-channel transistors that include one or bot of an LDD or DD region, the LDD or DD implant diffusions, with their larger dopant concentrations, more greatly influence the threshold voltage adjustment than does the enhancement implant. Therefore, processes that include both short and long-channels would necessarily exhibit differing threshold voltages since the threshold voltage of short-channel transistors is more greatly influenced by the SDD and DD implants while the threshold voltage of the long-channel transistors is more greatly influenced by the threshold voltage adjusting enhancement implant.

Figure 3:
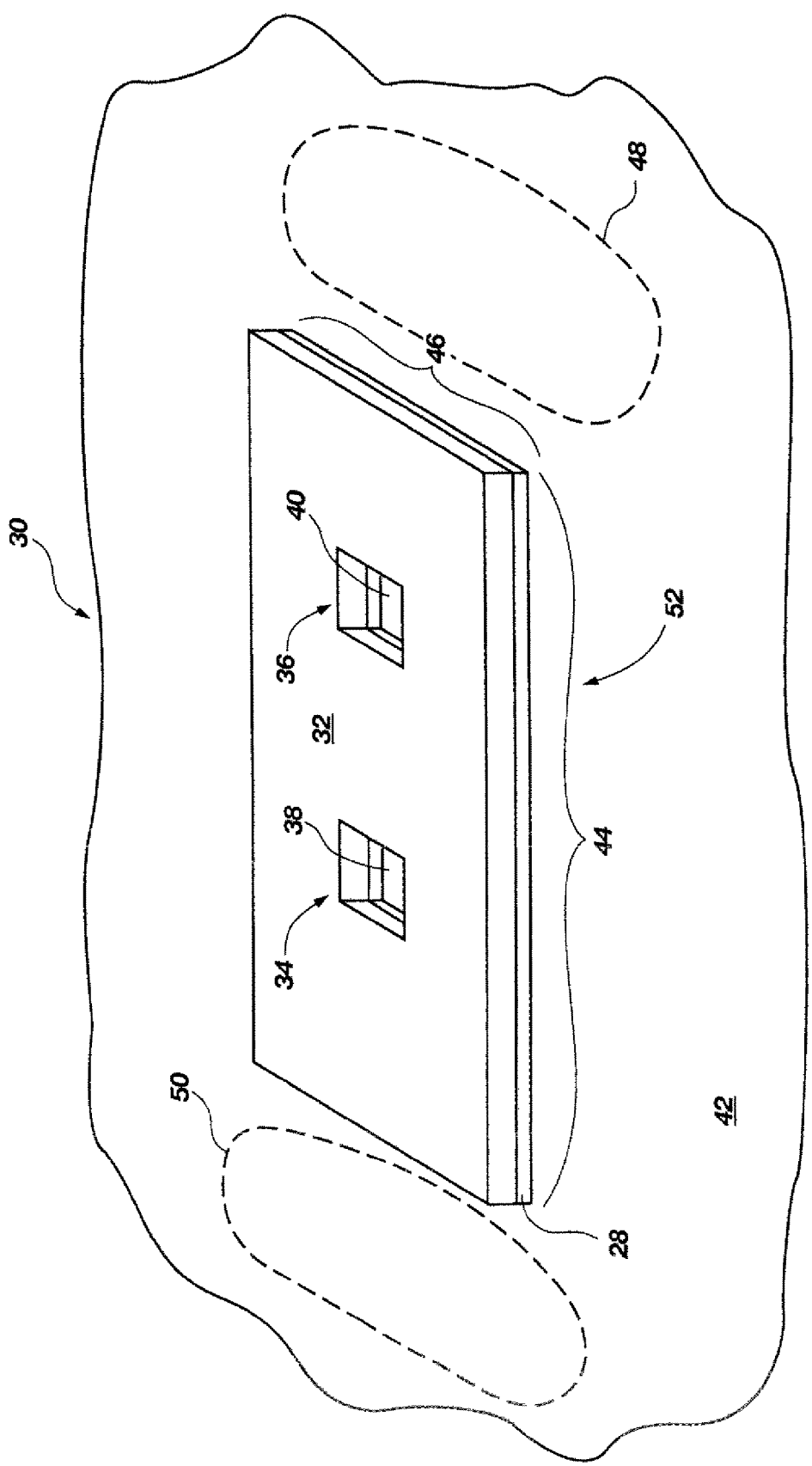
FIG. 3 is a perspective view of a transistor having a gate with internal implant apertures, in accordance with an embodiment of the present invention.

FIG. 3 is a perspective view of a transistor incorporating a channel implant process, in accordance with an embodiment of the present invention. A transistor 30 is formed upon and within a substrate 42 and generally includes a gate 32 formed upon a gate oxide 28 according to processes known by those of ordinary skill in the art. Transistor 30 further includes a drain region 48 and a respective source region 50 generally formed within substrate 42. In accordance with the channel implant process of an embodiment of the present invention, gate 32 further includes one or more apertures 34, 36 formed within the general body of gate 32. Apertures 34, 36 provide internal implant windows 38, 40 into the channel region 52 located generally below gate 32. The quantity of apertures 34, 36 is a function of the dimensions of the channel, namely channel length 44 and channel width 46. As viewed in a top view, apertures 34, 36 may be in the shape of a square, rectangle, circle, polygon, or any other uniform or non-uniform shape. However, a square aperture is shown in the drawing figures, and used as an example hereinafter. Additionally, the aperture, when viewed from the top, may be entirely or partially enclosed or surrounded by gate 32. For example, the aperture may be located on the edge of the gate 32 and not entirely enclosed with the gate material resulting in a notch, groove, keyhole, or the like. However, it is currently preferred that the aperture be enclosed within gate 32. The aperture may be formed by conventional mask and etch procedures either before or after the gate 32 is formed.

Figure 4:
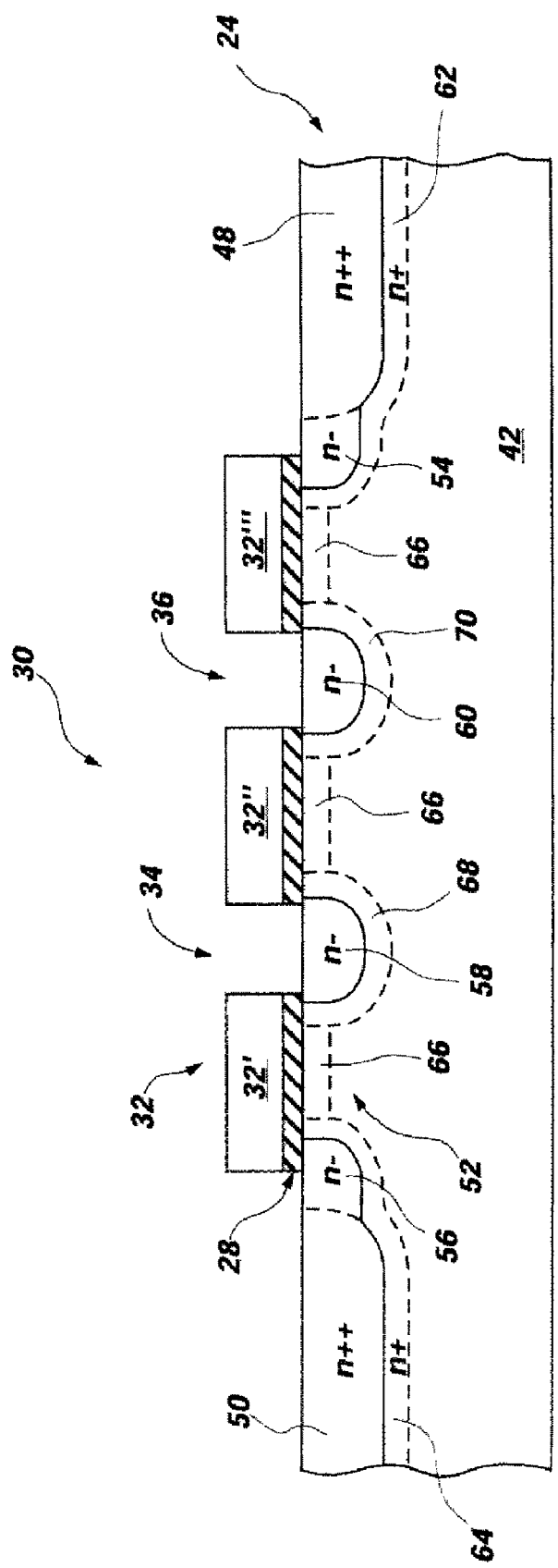
FIG. 4 is a cross-sectional view of a transistor having a gate with internal implant apertures, in accordance with an embodiment of the present invention.

FIG. 4 illustrates a cross-sectional view of transistor 30 formed according to the channel implant process, in accordance with an embodiment of the present invention. Transistor 30 further includes a gate 32 illustrated as including cross-sectional gate portions 32', 32" and 32'" which are separated by apertures 34, 36. Gate 32 is separated from substrate 42 by an insulating gate oxide 28 created in a channel region 52 on the side of substrate 42 adjacent to gate oxide 28.

Transistor 30 also includes drain region 48 and source region 50 separated by the channel region 52. Drain region 48 includes a main portion and an adjacently located inward lightly doped extension illustrated as LDD structure 54. LDD structure 54 may extend slightly under gate portion 32'". The source region 50 of transistor 30 is formed simultaneously with the drain region 48 and is typically configured in a like manner. The source region 50 includes a main source portion and a more lightly doped extension illustrated as LDD structure 56. Similarly, through one or more apertures 34, 36, channel internal implanted regions such as additional LDD structures 58, 60 are also formed. The purpose of the first implant is to form LDD structures at the edge near the channel and to provide internal implanting within the channel. In an LDD structure, almost the entire voltage drop occurs across the lightly doped drain region.

Additional more heavily doped implants such as double diffused (DD) implants may also be formed about drain region 48 and source region 50. DD implants are generally illustrated as DD structures 62, 64 and are typically more heavily doped than the original enhancement implants generally illustrated as enhancement implant 66. In accordance with an embodiment of the present invention, DD implants are also performed through apertures 34, 36 to form DD structures 68, 70 located within the internal channel region 52 of transistor 30.

By way of example and not limitation, the relative doping densities as described herein include enhancement implants on the order of $E^{12}$ and LDD implants on the order of $E^{12}$. Furthermore, DD implants are implanted at, for example, densities on the order of $E^{13}$ while the source and drain regions are implanted at levels on the order of $E^{15}$. Therefore, it is evident that for short-channel transistors where the LDD and DD structures occupy a significant portion of the channel length, the LDD and DD implants more greatly influence the threshold voltage of the transistor than a threshold voltage adjusting enhancement implant. Embodiments of the present invention enable implanting through the use of apertures distributed about the internal arrangement of the longer gate structures dominating doping densities into the longer channels consistent with the dominant doping densities implanted in shorter channel devices.

To form the source and drain regions, spacers 114, 116 (FIG. 5E) are formed around the gate. With the shallow drain extension junctions protected by the spacers, a second implant with heavier dose is self-aligned to the oxide spacers around the gate to form deep source/drain junctions illustrated as source/drain regions 50, 48. Generally, a rapid thermal annealing occurs (RTA) to enhance the diffusion of the dopants implanted in the deep source/drain junctions. The source/drain implant with heavier doses form low resistance deep drain junctions, which are coupled to the LDD structures. Since the source/drain implant is spaced from the channel by the spacers, the resulting drain junction adjacent to the lightly doped drain region can be made deeper without impacting device operation. The increase junction depth lowers the sheet resistance and the contact resistance of the drain.

In most typical LDD structures for CMOS devices, sources/drains are formed by four implants with dopants, each implant requiring a masking step. The four masking steps are: a first mask (a P-LDD mask) to form the P-LDD structures, a second mask (an N-LDD mask) to form the N-LDD structures, a third mask (a P+ S/D mask) to form the p-type doped, deep source/drain junctions, and a fourth mask (an N+ S/D mask) to form the n-type doped, deep source/drain junctions. Each masking step typically includes the sequential steps of preparing the semiconductor substrate, applying a photoresist material, soft-baking, patterning and etching the photoresist to form the respective mask, hard-baking, implanting a desired dose of a dopant with the required conductivity type, stripping the photoresist, and then cleaning of the substrate 24.

Figure 5A:
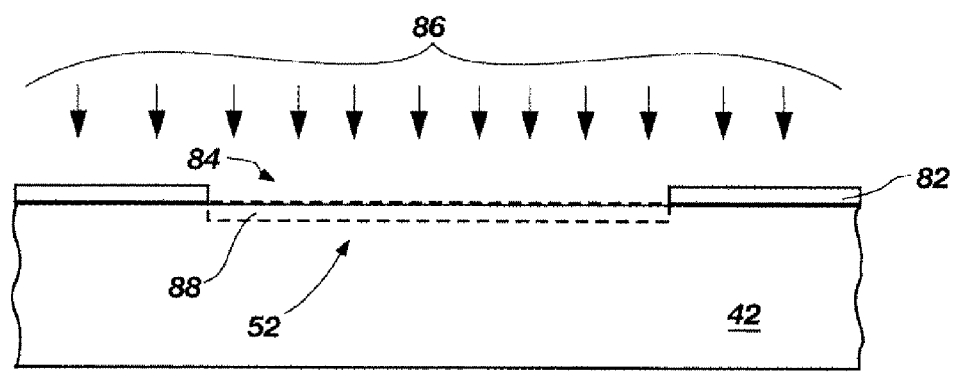
FIGS. 5A-5F illustrate processing steps for forming a transistor including implant regions throughout a channel, in accordance with an embodiment of the present invention.

FIGS. 5A-5F (hereinafter collectively "FIG. 5") illustrate a cross-sectional view of a portion of the silicon wafer during various processing steps to create the transistor structure of FIG. 4, according to an embodiment of the present invention. While the present illustration depicts a p-type substrate forming an n-channel MOS transistor, a p-channel transistor may also be implemented according to the processes described herein as modified by processes known by those of ordinary skill in the art. Referring to FIG. 5A, a substrate 42 has applied thereon a masking layer 82 which is applied and patterned according to processes known by those of ordinary skill in the art. The patterning process creates an opening 84 which corresponds to the channel region 52 of a developing transistor. An enhancement implant 86 creates an enhancement region 88 which typically facilitates threshold voltage adjustment in a transistor device. By way of example, the threshold voltage of an n-channel transistor would be adjusted by introducing a p-type dopant, typically boron, into at least a portion of the channel region 52.

Figure 5B:
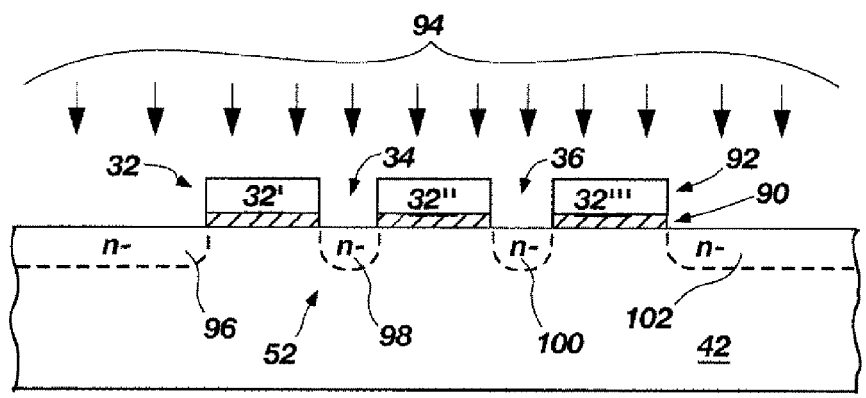

FIG. 5B illustrates the process for forming an LDD structure, in accordance with an embodiment of the present invention. In this process, a gate insulating oxide 90 is formed over the previously defined channel region 52 with a gate layer 92, such as a polysilicon layer, deposited over gate insulating oxide 90. Furthermore, gate 32 has formed therein one or more apertures 34, 36 for facilitating implantation within the outer periphery of gate 32. Using gate 32 as a mask, impurity ions, for example n-type impurity ions, are generally vertically implanted as LDD implant 94 into substrate 42 in a low concentration, thereby forming LDD structures 96, 98, 100, 102.

Figure 5C:
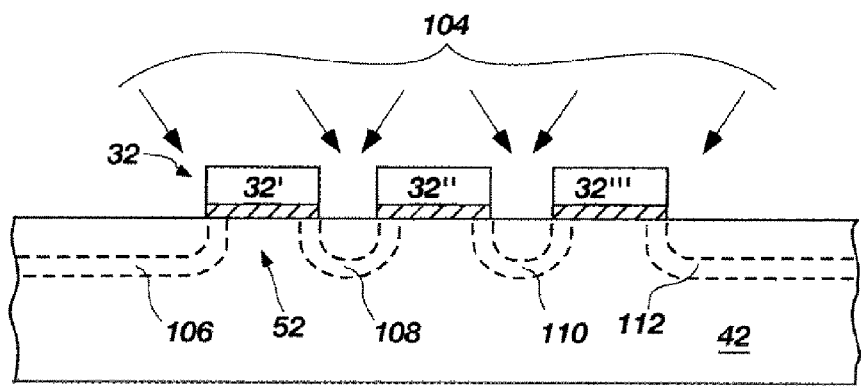

FIG. 5C illustrates a double diffusion (DD) implant 104 into substrate 42 for forming punch-through inhibitors. For the n-channel example of the present embodiment, a p-type dopant is angle-implanted as an ion implantation with portions of the p-type implant penetrating laterally under gate portions 32', 32", 32''' due to the angular implant process. In a preferred implantation process, substrate 42 is rotated in preferably four separate rotations for facilitating the angular implantation about the generally rectangular profile of gate 32. The angular DD implant 104 results in implant regions 106, 108, 110, and 112.

Figure 5D:
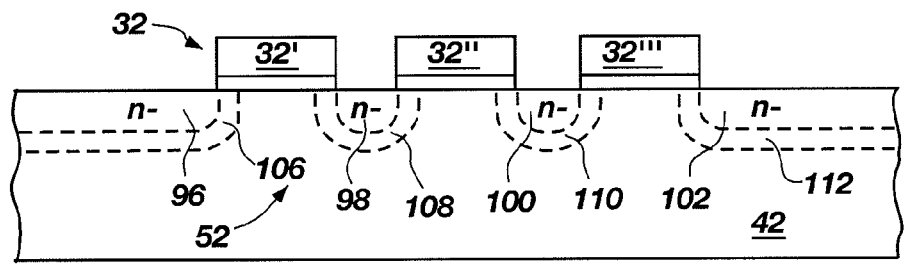

In an annealing process as depicted in FIG. 5D, the various implantation ions of both the LDD implants 94 and DD implants 104 result in further penetration of the implant ions into substrate 42. As illustrated, the LOD structures (or n– regions) 96-102 as well as the DD implant regions 106-112 migrate under the channel region 52 located under the gate 32. Migration of the higher dopant concentrations of the LDD implants and the DD implants minimizes the impact of the enhancement implant 86 of FIG. 5A and causes the threshold voltage to change according to the additional dopant concentrations.

Figure 5E:
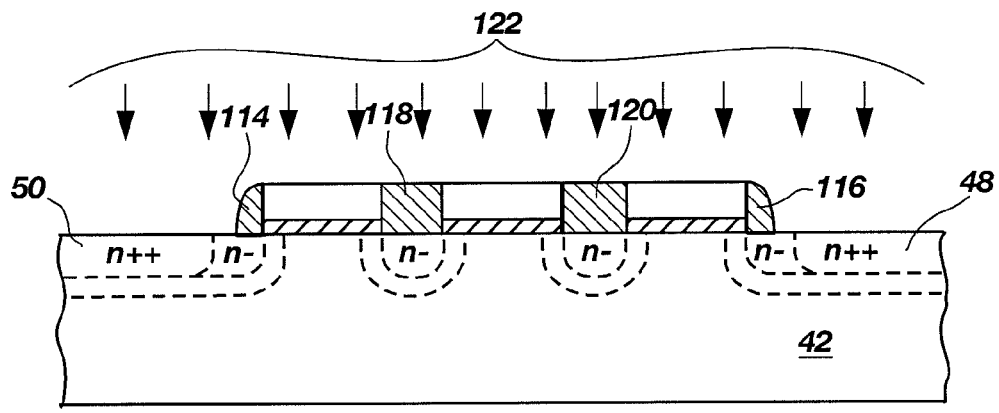
Figure 5F:
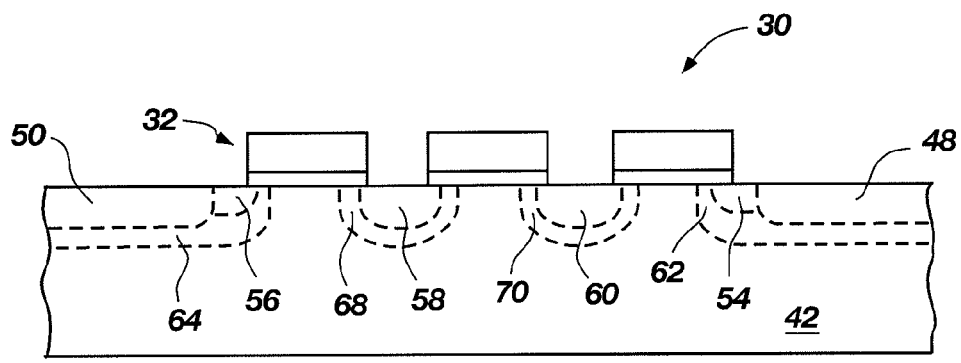

In FIG. 5E, spacers 114, 116 as well as implant shields 118, 120 protect the underlying structures from the high concentration source/drain implant 122 while the source region 50 and drain region 48 are implanted. As illustrated in FIG. 5F, spacers 114, 116 and implant shields 118, 120 are removed to complete the formation of transistor 30. As illustrated, transistor 30 is comprised of a gate 32, drain and source regions 48, 50 as well as drain and source specific LDD structures 54, 56 and drain and source specific DD structures 62, 64. Transistor 30 further comprises one or more internal LDD structures 58, 60 as well as one or more internal DD structures (or regions) 68, 70. The formation of internal structures, through the use of implants throughout the length of the channel, more consistently aligns the threshold voltage of a long-channel transistor with the threshold voltage of a short-channel transistor and thereby reduces the disparate threshold voltages between respective long- and short-channel transistors while eliminating independent threshold voltage enhancement implants for long and short-channel transistors.

Figure 6:
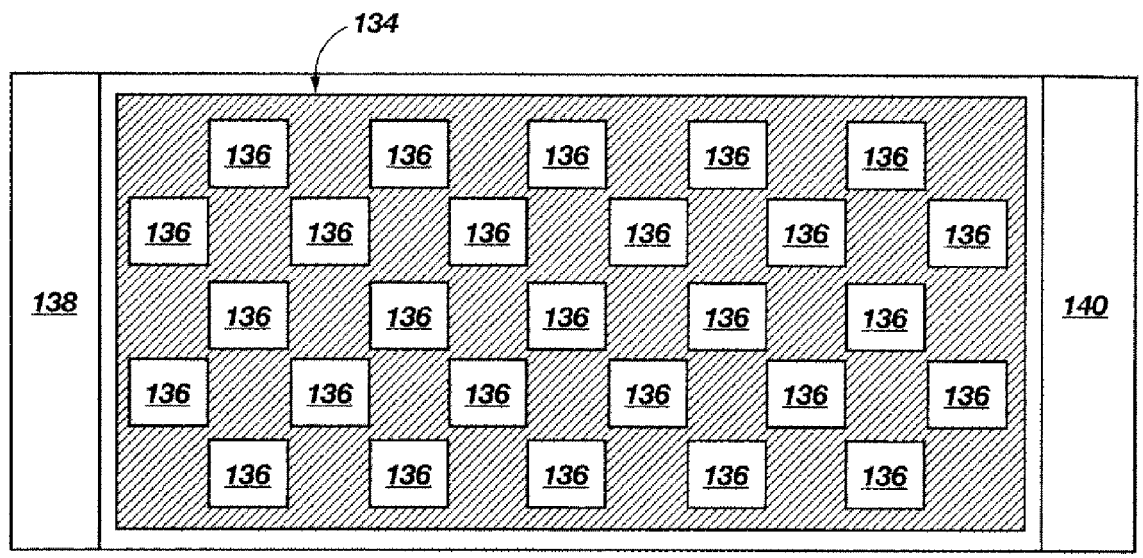
FIG. 6 illustrates an arrangement of implant windows along a gate of a transistor, in accordance with an embodiment of the present invention.
Figure 7:
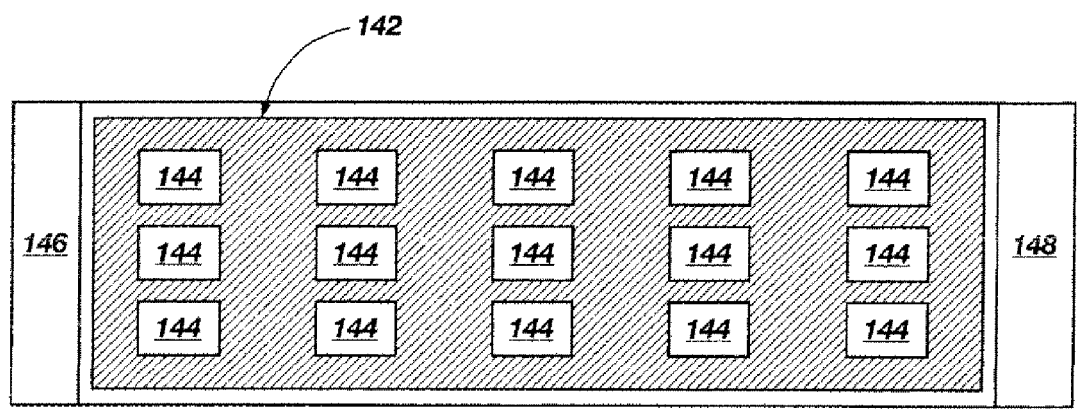
FIG. 7 illustrates an arrangement of implant windows along a gate of a transistor, in accordance with another embodiment of the present invention.
Figure 8:
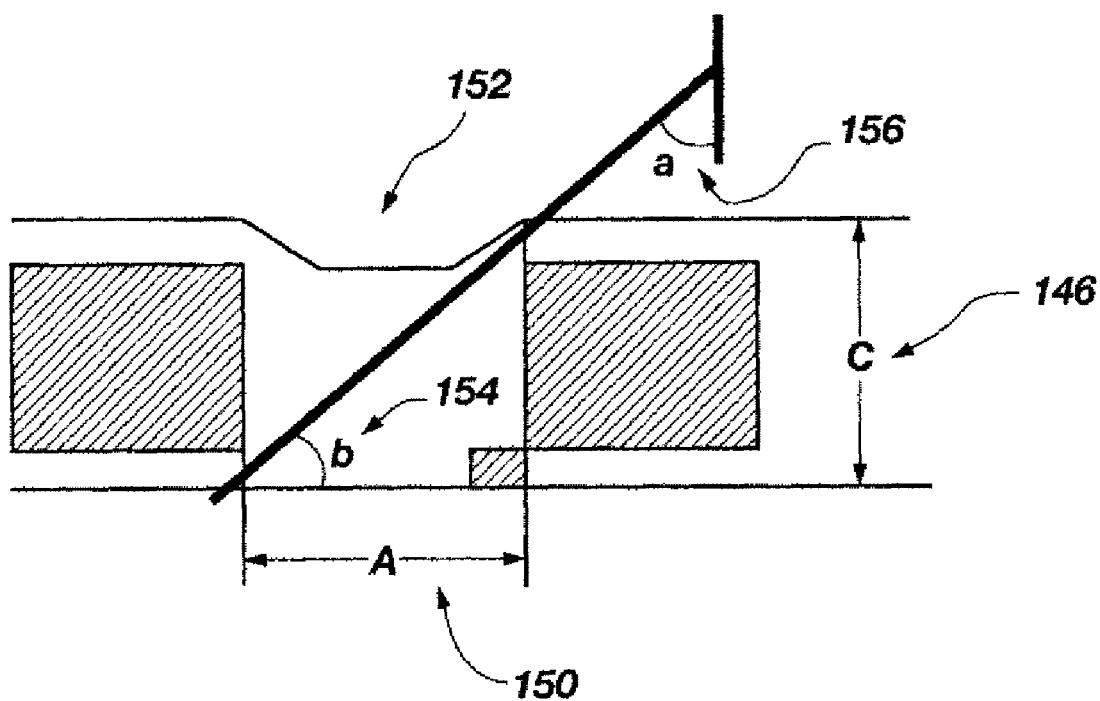
FIG. 8 illustrates angular relationships of an implant aperture, in accordance with an embodiment of the present invention.

FIGS. 6 and 7 illustrate grid arrangements of apertures, according to specific embodiments of the present invention. In FIG. 6, the formation of a gate 134 includes an exemplary pattern of apertures 136 for the gate 134 shown in a "checkerboard" pattern between a source region 138 and a drain region 140. In addition, an exemplary method for calculating the width of aperture 136 with respect to gate 134 height and implantation angle (b) is shown in FIG. 8. One current exemplary embodiment includes a gate length of about 0.1 micron to 4 microns. FIG. 7 illustrates the formation of apertures in a gate, in accordance with another embodiment of the present invention. A gate 142 includes an exemplary two-dimensional array of apertures 144 located between a source region 146 and a drain region 148. Further geometries and aperture shapes are also contemplated within the scope of the present invention.

FIG. 8 illustrates an exemplary aperture in accordance with an embodiment of the present invention. The dimensions (A) 150 of an aperture 152 may be determined by the gate height, desired ion implantation angle (b) 154, and process or manufacturing capabilities. For example, as shown in FIG. 8, if the gate height is 1200 Å and the desired ion implantation angle (b) 154 is 65°, the dimension (A) 150 would be (1200 Å/tan 65°) or 560 Å. With current process or manufacturing capabilities, the aperture 152 dimensions are currently preferred to be greater than 0.02 micron by 0.02 micron. However, the aperture 152 dimension (A) should be small enough to allow the fringe effects from the gate field to electrically invert the charge of the area under the aperture 152 when a voltage is applied to the gate.

The angle (b) 154 shown in FIG. 8 is the angle for driving the dopants into the under layer in the channel region 52 (FIG. 5B). As an example, for a square aperture, this implantation will take place through the device apertures and gate edge and then the device or implantation equipment will be rotated 90° and then the implantation will take place again. This process will allow for the dopant to be implanted into the channel region 52 of the device on all four sides of a square aperture once a full revolution has been completed. The device or implantation device may turn or rotate more or less times and at a greater or lesser angle to implant the dopant into the channel region 52 depending on the shape of the aperture to get a uniform diffusion under the aperture. Implanting the dopant at the angle (b) 154 will create "fringe" effect regions in the channel region 52 of the device. The angle (a) 156 of the implant at the apertures is currently preferred to be 0 to 25 degrees. The angle is determined by how far the dopant is to be driven under the gate. For example, a small angle (a) 156 will not drive the dopant as far under the gate as a large angle (a) 156 implant. As a result of a smaller angle (a) 156, the fringing of the implant will be reduced in the channel region 52. An exemplary ion implant is phosphorus (P) to provide a negative (n−) doping of the channel region 52.

Embodiments of the present invention utilize the implant process for forming one or more of an LDD or a DD region in a short-channel transistor for 'enhancing' the concentration of dopants in the channel of a long-channel transistor. Therefore, both the short-channel and long-channel transistors exhibit similar threshold voltages as adjusted by the LDD and/or DD implanting processes internal to the channel.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention includes all modifications, equivalents, and alternatives falling within the spirit and scope of the invention as defined by the following appended claims.

What is claimed is:

1. A method for forming a transistor, comprising:
forming a drain region and a source region with a channel region therebetween in a substrate, the channel region extending in a plane parallel with a major plane of the substrate;
forming a gate including at least one aperture extending therethrough to the substrate; and
forming doped regions in at least a portion of the channel region in the substrate below the at least one aperture of the gate.

2. The method of claim 1, further comprising forming at least one lightly doped structure in the channel region.

3. The method of claim 2, further comprising forming doped regions in the substrate adjacent to source and drain ends of the gate.

4. The method of claim 3, further comprising forming a double-diffused structure at least partially surrounding each of the doped regions below the at least one aperture of the gate and the at least one lightly doped structure.

5. The method of claim 1, further comprising implanting at a diagonal angle to the gate and through the at least one aperture of the gate.

6. The method of claim 2, further comprising forming an enhancement region in the substrate located within at least a portion of the channel region.

7. The method of claim 3, further comprising forming the doped regions according to a single fabrication process.

8. The method of claim 2, further including forming the at least one lightly doped structure as a lightly doped drain (LDD) structure arranged between one of the source and drain regions and the channel region.

9. The method of claim 1, wherein the at least one aperture comprises a plurality of apertures distributed along the gate.

10. A method for adjusting a threshold voltage of a transistor, comprising:
forming at least one aperture in a gate to a channel region of a substrate, the gate forming a transistor with the channel region extending between a drain region and a source region in a direction parallel with a major direction of the substrate; and
implanting a first dopant through the at least one aperture into at least a portion of the channel region of the substrate.

11. The method of claim 10, further comprising implanting a second dopant into the at least one aperture and annealing the second dopant to form a double-diffused structure at least partially surrounding the first dopant.

12. The method of claim 11, wherein the implanting of the second dopant occurs at an angle off-vertical through the at least one aperture of the gate.

13. The method of claim 10, wherein forming comprises arranging a plurality of apertures along a length of the gate.

14. A method of forming a transistor, comprising:
forming a device including a substrate with a source, a drain, and a gate formed thereon, the gate including at least one aperture to at least a portion of a channel region between the source and the drain, the channel region extending in a plane parallel with a major plane of the substrate; and
implanting a dopant through the at least one aperture.

* * * * *